United States Patent
Ahn et al.

(10) Patent No.: US 7,239,856 B2
(45) Date of Patent: Jul. 3, 2007

(54) APPARATUS AND METHOD FOR COMPENSATING GAIN OF AN AUTOMATIC GAIN CONTROLLER

(75) Inventors: Seong-Woo Ahn, Yongin-shi (KR); Seo-Weon Heo, Seoul (KR); Sang-Min Bae, Kyonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 385 days.

(21) Appl. No.: 10/691,645

(22) Filed: Oct. 24, 2003

(65) Prior Publication Data

US 2004/0102168 A1    May 27, 2004

(30) Foreign Application Priority Data

Oct. 24, 2002    (KR) .................. 10-2002-0065240

(51) Int. Cl.
*H04B 1/06*     (2006.01)
*H04B 7/00*     (2006.01)

(52) U.S. Cl. ............................. 455/127.2; 455/234.1; 455/239.1

(58) Field of Classification Search .......... 455/127.2, 455/127.3, 127.4, 138, 177.1, 200.1, 232.1, 455/234.1, 205.1, 334, 293, 240.1, 250.1, 455/251.1
See application file for complete search history.

(56) References Cited

U.S. PATENT DOCUMENTS 4,439,864 A    3/1984    Qureshi ..................... 375/239

| 5,812,025 | A * | 9/1998 | Shimazaki .................. 330/129 |
| 6,321,073 | B1 * | 11/2001 | Luz et al. ................ 455/239.1 |
| 6,625,433 | B1 * | 9/2003 | Poirier et al. ............ 455/232.1 |
| 6,640,111 | B1 * | 10/2003 | Shapira .................... 455/562.1 |
| 2001/0028275 | A1 | 10/2001 | Matsugatani et al. ....... 330/281 |
| 2003/0068991 | A1 * | 4/2003 | Lee ........................... 455/126 |
| 2003/0114126 | A1 | 6/2003 | Wang et al. ............. 455/234.2 |

FOREIGN PATENT DOCUMENTS

| EP | 1041727 | 10/2000 |
| JP | 2002164755 | 7/2002 |
| KR | 1020000041188 | 7/2000 |
| KR | 1020010038806 | 5/2001 |
| KR | 1020010084821 | 9/2001 |
| KR | 1020020045866 | 6/2002 |

* cited by examiner

*Primary Examiner*—Tony T. Nguyen
(74) *Attorney, Agent, or Firm*—Roylance, Abrams, Berdo & Goodman, L.L.P.

(57) ABSTRACT

An apparatus and method for compensating the gain of an Automatic Gain Controller (AGC) for stabilizing the reception power of discontinuously transmitted packet data in a mobile communication system are disclosed. A compensation controller receives an AGC value from the AGC, sampling the AGC value by a predetermined sample number for a predetermined period, and obtains an AGC compensation gain by comparing a predetermined value with the difference between a sampled AGC value with a reference gain for the predetermined period. A compensator compensates the AGC value with the AGC compensation gain, thereby correcting errors generated in view of the nature of the AGC.

16 Claims, 7 Drawing Sheets

APPARATUS AND METHOD FOR COMPENSATING GAIN OF AN AUTOMATIC GAIN CONTROLLER

PRIORITY

This application claims priority under 35 U.S.C. § 119 to an application entitled "Apparatus and Method for Compensating Gain of Automatic Gain Controller" filed in the Korean Intellectual Property Office on Oct. 24, 2002 and assigned Serial No. 2002-65240, the contents of which are incorporated herein by reference.

BACKGROUND OF THE INVENTION

1. Field of the Invention

The present invention relates generally to an automatic gain control apparatus and method, and in particular, to an apparatus and method for compensating the gain of an automatic gain controller (AGC) in order to stabilize the received signal power of discontinuously transmitted high-rate packet data in a mobile communication system.

2. Description of the Related Art

Mobile communication systems for high-rate packet data transmission (hereinafter, referred to as a high-rate packet transmission mobile communication system) usually support only data channels or support both data and voice channels. The former is referred to as an International Mobile Telecommunication-2000 (IMT-2000) Evolution-Data Only (1xEV-DO), while the latter is referred to as an IMT-2000 Evolution-Data and Voice (1xEV-DV).

To realize high-rate data transmission, a plurality of users share the same channel for Time Division Multiplexing (TDM) in the high-rate packet transmission mobile communication systems. A base station receives feedback forward channel state information from a mobile station and if the channel state is acceptable, the base station transmits data in a high-order modulation scheme such as 8 Phase Shift Keying (PSK), 16 Quadrature Amplitude Modulation (QAM), or 64-QAM to achieve a higher data rate. Since a forward packet channel is shared among a plurality of users in TDM, the base station assigns all available transmission power to one or two particular users in a time slot assigned to the users.

Because packet data is usually generated discontinuously, there exist periods where packets are not transmitted e.g., non-packet transmission periods. Hence, if the received signal level of packet data is not kept constant, the use of a high-order modulation such as 64-QAM leads to poor packet reception quality. A typical solution is to use an AGC. The structure of the AGC and the level variations of a signal received at a receiver will be described below with reference to FIG. 1 to FIG. 2C.

FIG. 1 is a block diagram of a typical AGC for keeping a received signal level constant.

Referring to FIG. 1, the AGC comprises a gain controlled amplifier (GCA) 10 for receiving a signal s(t) from an antenna (not shown), an accumulator 20 for accumulating the output of the GCA 10 for a predetermined period, an adder 30 for adding the output of the accumulator 20 to a target reference voltage AIM_AMP, and a feedback loop filter 40 having a predetermined bandwidth, for filtering the output of the adder 30.

The GCA 10 is an amplifier controlled by a feedback signal.

During operation, an input signal is fed to the GCA 10. The output of the GCA 10 is divided into two parts and one of part of the output is fed to the accumulator 20. The adder 30 adds an accumulated signal received from the accumulator 20 to the reference voltage AIM_AMP with a negative value. That is, the adder 30 computes the difference between the output of the accumulator 20 and the reference voltage AIM_AMP. The feedback loop filter 40 filters the signal of the difference and the GCA 10 amplifies the input signal with the filtered signal.

The level variations of a signal received from a base station will be described in connection with the structure of the AGC.

FIGS. 2A, 2B and 2C are timing diagrams illustrating transmitted power level variations and received power level variations for discontinuous packet transmission. More specifically, FIG. 2A illustrates base station transmission power $I_{or}$, FIG. 2B illustrates the level of a received signal $\hat{I}_{o\_AGC}$ controlled by the AGC, and FIG. 2C illustrates a control signal $V_c(t)$ for controlling the GCA in the loop of the AGC according to the variation of the base station transmission power $I_{or}$. It should be noted that the base station transmission power $I_{or}$ reaches a maximum value $P_{max}$ during a transmission period from t1 to t3, but falls to a normal value $P_{normal}$ during a non-packet transmission period.

However, the controlled received signal level $\hat{I}_{o\_AGC}$ is not kept constant due to the rapid variation of the transmitted signal at the transmission start point t1 or the transmission end point t3 because the AGC generally operates in a loop control manner. Thus, some time is taken until the AGC loop is stabilized. It is an evitable AGC error under the assumption of an ideal AGC. Therefore, most high-rate packet receivers face the same problem in relation to discontinuous packet transmission.

High-rate packet data transmission involves a high-order modulation like QPSK/8-PSK or a higher-order modulation scheme such as 16-QAM/64-QAM. Demodulation performance is greatly degraded if the AGC error caused by discontinuous packet transmission makes the power level of an input signal inconstant.

Moreover, the AGC error lasting until the stabilization of the AGC during the discontinuous packet transmission changes the received power level in one slot, which significantly affects the demodulation performance of 16-QAM/64-QAM. Therefore, there is a need for an algorithm for reducing the power level variation of a signal output from the AGC in one slot.

SUMMARY OF THE INVENTION

An object of the present invention is to provide an apparatus and method for keeping constant the level of received power measured during a packet transmission period in a high-rate packet transmission mobile communication system.

Another object of the present invention is to provide an apparatus and method for preventing the decrease of reception quality caused by discontinuous packet transmission in a high-rate packet transmission mobile communication system.

A further object of the present invention is to provide an apparatus and method for compensating for the power level changes of a distorted received signal in a high-rate packet transmission mobile communication system.

Still another object of the present invention is to provide an apparatus and method for compensating for the power level changes of a distorted received signal without modifying the structure of a receiver in a high-rate packet transmission mobile communication system.

The above objects are achieved by an apparatus and method of compensating the gain of an AGC in a receiver including the AGC for controlling the gain of received packet data in a mobile communication system where packet data is discontinuously transmitted.

In the AGC gain compensating apparatus, a compensation controller receives an AGC value from the AGC, samples the AGC value by a predetermined sample number for a predetermined period, and obtains an AGC compensation gain by comparing a predetermined value with the difference between a sampled AGC value with a reference gain for the predetermined period. A compensator compensates the AGC value with the AGC compensation gain, thereby correcting errors generated in view of the nature of the AGC. This apparatus further includes an offset compensator for compensating the power level of the compensated AGC value with an AGC compensation offset calculated in the compensation controller.

In the AGC gain compensating method, an AGC value from the AGC is sampled by a predetermined sample number for a predetermined period, and an AGC compensation gain is obtained by comparing a predetermined value with the difference between a sampled AGC value with a reference gain for the predetermined period. The AGC value is compensated with the AGC compensation gain, thereby correcting errors generated in view of the nature of the AGC. Furthermore, an AGC compensation offset is obtained using the difference between the reference gain for a present period and a reference gain for a next period extracted in response to a next reference gain clock signal when the predetermined period expires, and the power level of the compensated AGC value is compensated with the AGC compensation offset.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Figure 1:
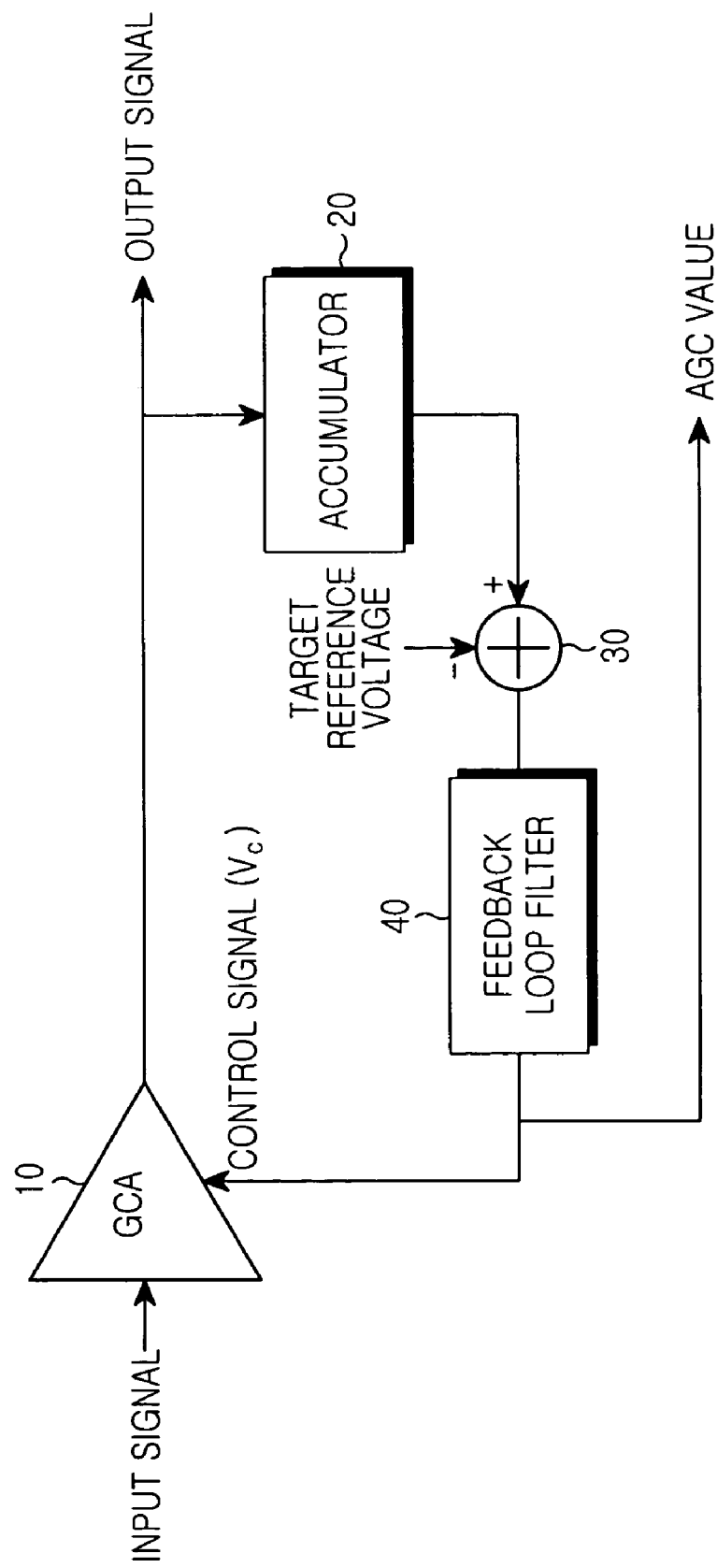
FIG. 1 is a block diagram of a conventional Automatic Gain Controller (AGC) for keeping the power level of a received signal constant.

Embodiments of the present invention will be described herein below with reference to the accompanying drawings. It should be noted that like reference numerals denote the same components in the drawings.

Many specific details, such as specific signals and signal levels, which are shown in the following description, are disclosed for the purpose of helping to form a comprehensive understanding of the embodiments of the present invention. It should be appreciated by those skilled in the art that the embodiments of the present invention may be implemented without these details. In addition, well-known functions or constructions are omitted for conciseness.

Figure 2A:
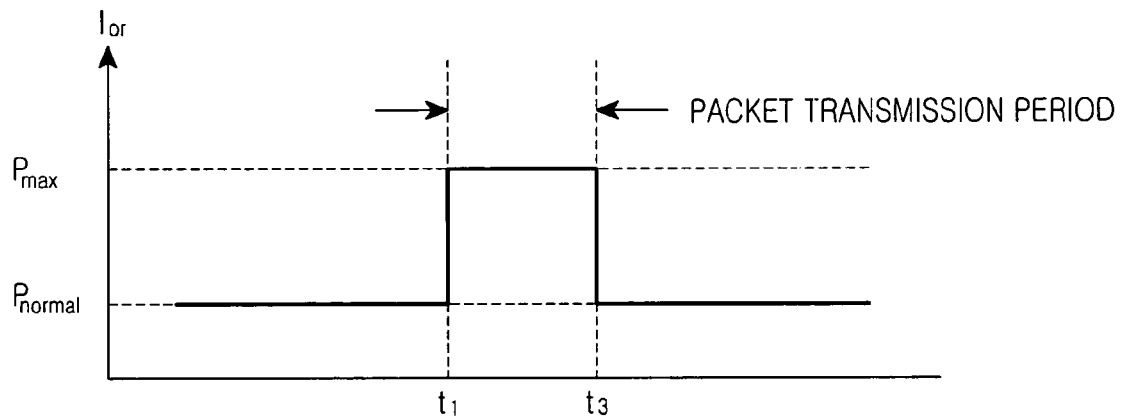
FIGS. 2A, 2B and 2C are timing diagrams illustrating changes in transmission power, received power, and AGC control signal power in the conventional technology.
Figure 2B:
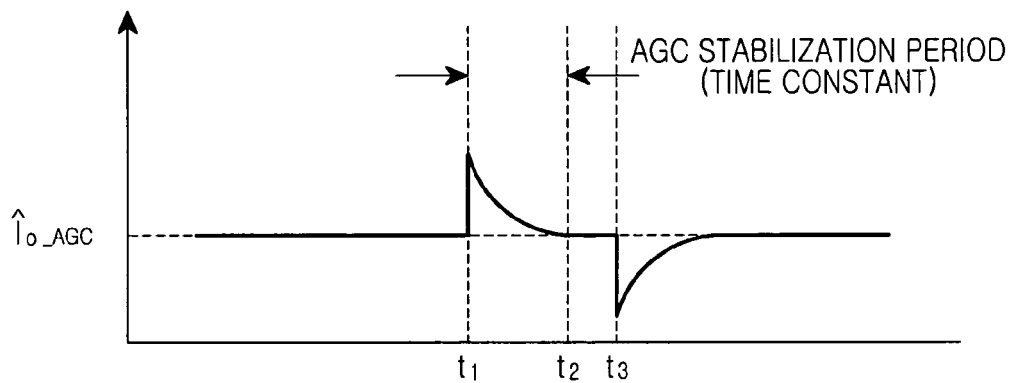

The embodiments of the present invention will be described in the context of a forward link in a high-rate packet transmission mobile communication system that supports multimedia service including voice and data services using the Code Division Multiple Access (1xCDMA) bandwidth. The 1xCDMA bandwidth is a 1.25-MHz frequency bandwidth found in existing IS-95 synchronous systems in North America. It is used to determine a slot boundary reference signal T125 that in turn determines a clock cycle in an embodiment of the present invention. As packet data is discontinuously transmitted, it follows that transmission power rapidly changes at the transmission start point t1 or the transmission end point t3, and as a result, the Automatic Gain Controller (AGC) 110 fails to keep received power constant, as illustrated in FIG. 2B.

The implementation of an AGC gain compensating algorithm in a mobile station receiver according to an embodiment of the present invention will be described below.

Figure 3:
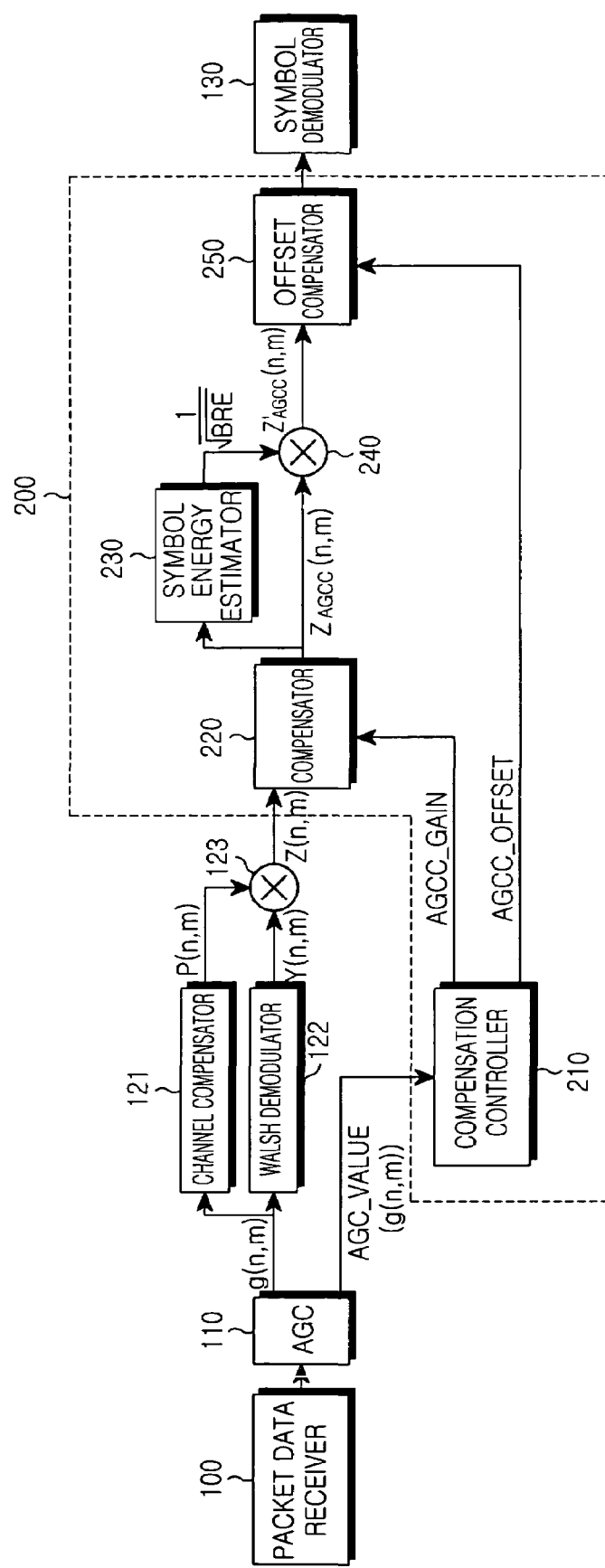
FIG. 3 is a block diagram illustrating an apparatus for compensating the gain of an AGC in a mobile station receiver in a mobile communication system according to an embodiment of the present invention.

FIG. 3 is a block diagram of an apparatus for compensating the gain of an AGC in a mobile station receiver according to an embodiment of the present invention.

Referring to FIG. 3, the mobile station receiver includes a packet data receiver 100, the AGC 110, which is a gain compensating apparatus, and a symbol demodulator. The AGC 110 stabilizes the power level of discontinuous packet data received from the packet data receiver 100 via gain control and outputs an AGC value AGC_VALUE. AGC_VALUE represents the power level of a distorted signal generated during the time required for stabilization in the loop structure of the AGC 110. It is the gain of one symbol in a slot. The gain compensating apparatus is comprised of a channel compensator 121, a Walsh demodulator 122, a first multiplier 123, and a compensation unit 200.

The channel compensator 121 compensates a packet data channel and the Walsh demodulator 122 demodulates the received packet data with a Walsh code. The first multiplier 123 multiplies the channel compensated signal by the Walsh-demodulated signal and outputs the product as the distorted signal to be compensated, that is, an actual AGC value $Z(n, m)$ to be compensated.

The compensation unit 200 has a compensation controller 210, a compensator 220, a symbol energy estimator 230, a second multiplier 240, and an offset compensator 250. The compensation controller 210 calculates an AGC compensation gain AGCC_GAIN and an AGC compensation offset AGCC_OFFSET with which to compensate AGC_VALUE. The compensator 220 compensates $Z(n, m)$ with AGCC_GAIN. The symbol energy estimator 230 estimates a reference energy for the compensated gain $Z_{AGCC}(n, m)$ received from the compensator 220. The second multiplier 240 multiplies the estimated symbol energy $$\frac{1}{\sqrt{BRE}}$$

by $Z_{AGCC}(n, m)$. The offset compensator 250 compensates the compensation gain product $Z'_{AGCC}(n, m)$ with AGC- C_OFFSET received from the compensation controller 210. It should be noted that AGCC_OFFSET is calculated only when needed. In other words, AGCC_OFFSET can be omitted if it is unnecessary.

The symbol energy estimator 230 adopts a blind estimation technique in which it estimates $$\frac{1}{\sqrt{BRE}}$$

using only the symbols of received data. Radio channel fading can be tracked by estimating $$\frac{1}{\sqrt{BRE}}$$

for each slot, and $$\frac{1}{\sqrt{BRE}}$$

is used as a reference energy when demodulating the symbols of a received slot.

The structure and operation of the compensation controller 210 in the compensation unit 200 will be described in detail with reference to FIG. 4.

Figure 4:
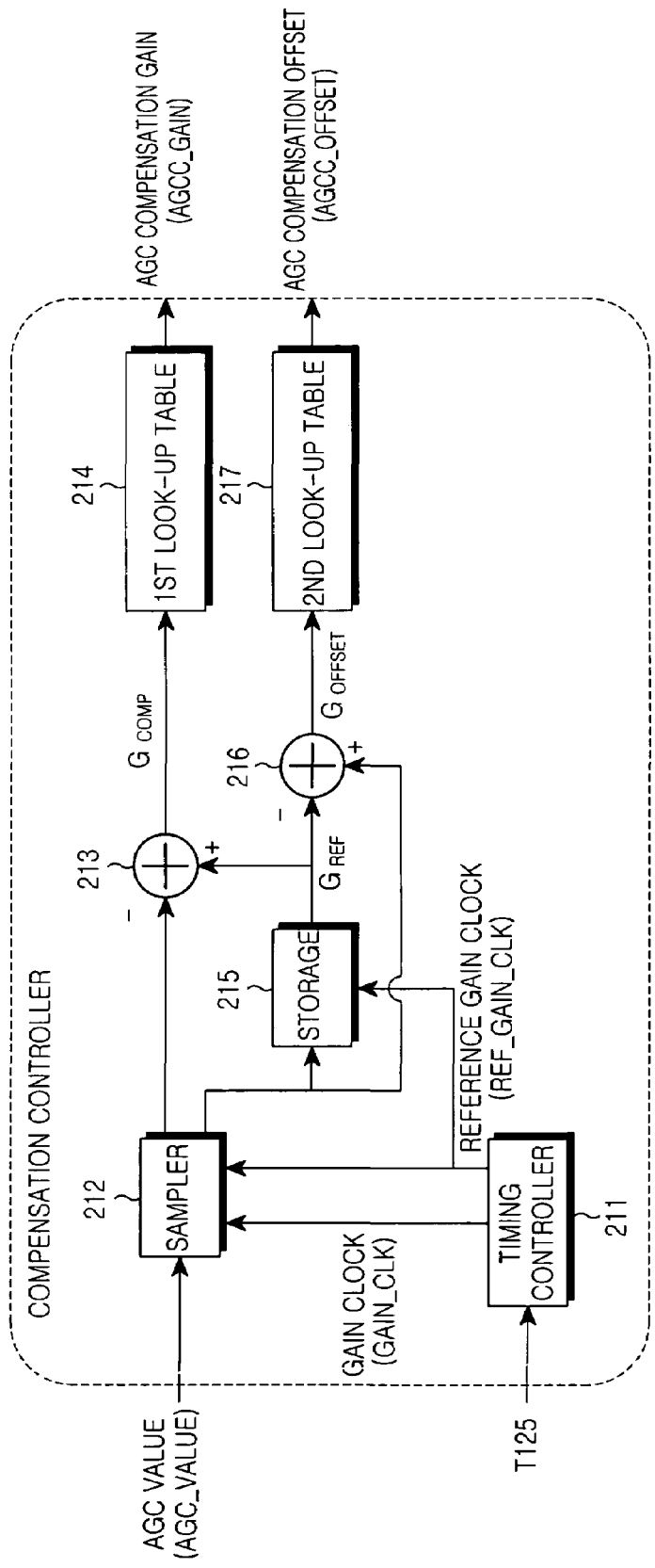
FIG. 4 is a block diagram illustrating a compensation controller in the gain compensating apparatus of FIG. 3.

FIG. 4 is a block diagram of the compensation controller 210 illustrated in FIG. 3.

Referring to FIG. 4, the compensation controller 210 comprises a timing controller 211, a sampler 212, a first subtractor 213, a first look-up table, a storage 215, a second subtractor 216, and a second look-up table 217. The timing controller 211 generates a gain clock signal GAIN_CLK and a reference gain clock signal REF_GAIN_CLK. REF_GAIN_CLK is synchronized to a slot boundary reference signal T125 of a predetermined period, and used as a sampling period for AGC_VALUE. The sampler 212 samples AGC_VALUE in response to the clock signals.

The storage 215 temporarily stores a signal output from the sampler 212 in response to REF_GAIN_CLK as a reference gain $G_{REF}$. The first subtractor 213 calculates the difference (i.e. compensation gain $G_{COMP}$) between $G_{REF}$ and an AGC value sample which is output from the sampler 212 in response to GAIN_CLK. The first look-up table 214 outputs AGCC_GAIN by comparing $G_{COMP}$ with a predetermined value. Here, the storage 215 is a D-flipflop connected to the timing controller 211 and operated in response to REF_GAIN_CLK.

The second subtractor 216 calculates the difference (i.e. compensation offset $G_{OFFSET}$) between the reference gain for the present slot and a reference gain for the next slot. The second look-up table 217 outputs AGCC_OFFSET by comparing $G_{OFFSET}$ with a predetermined value.

Returning to FIG. 3, the actual AGC value Z(n, m) to be compensated with AGCC_GAIN from the compensation controller 210 is determined by $$Z(n, m) = P(n, m)^* \times Y(n, m) \quad (1)$$
$$= (g(n, m)^2 h(n, m)^* P) \times [h(n, m) \times x(n, m) + n(n, m)]$$

where m is the index of a symbol in one slot, and n is the index of the slot. Z(n, m) is the product of the output P(n, m) of the channel compensator 121 and the output Y(n, m) of the Walsh-demodulator 212.

In Eq. (1), P is the strength of a pilot signal, g(n, m) is a gain reflected in a received signal by the AGC loop, h(n, m) is the product of x(n, m) to be multiplied by a carrier c, and the strength s(n, m) of a received signal s(t) added to P, and n(n, m) is added to h(n, m). These computations are performed in the packet data receiver 100 prior to input to the AGC 110.

FIGS. 5A to 5D are timing diagrams illustrating the power level variations of input signals needed to compensate the gain of the AGC 110.

Figure 5A:
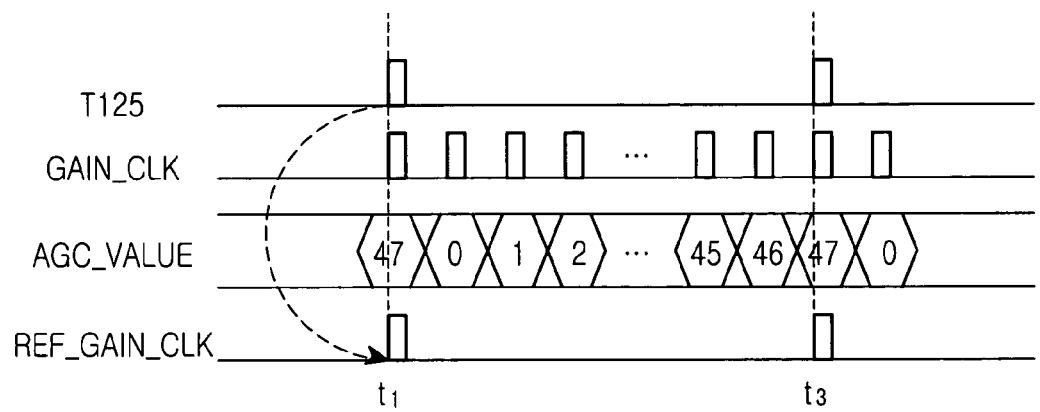
FIGS. 5A to 5D are timing diagrams illustrating the power level variations of input signals to compensate the gain of the AGC according to an embodiment of the present invention.
Figure 5B:
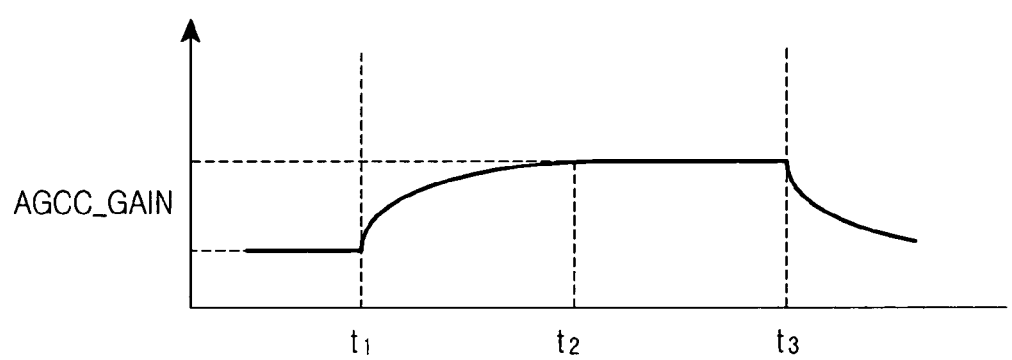
Figure 5C:
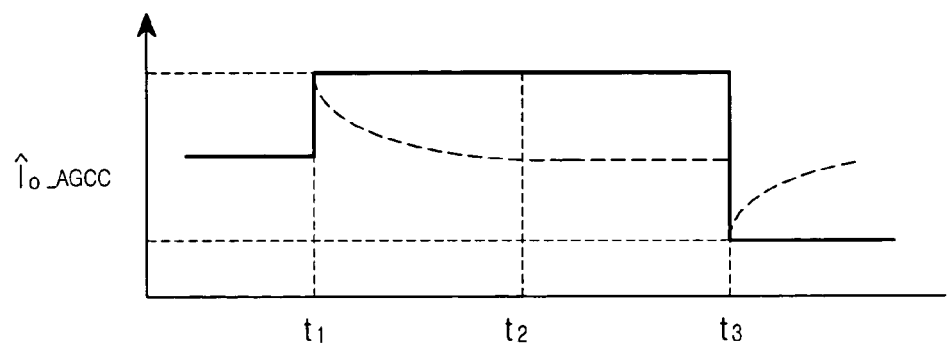
Figure 5D:
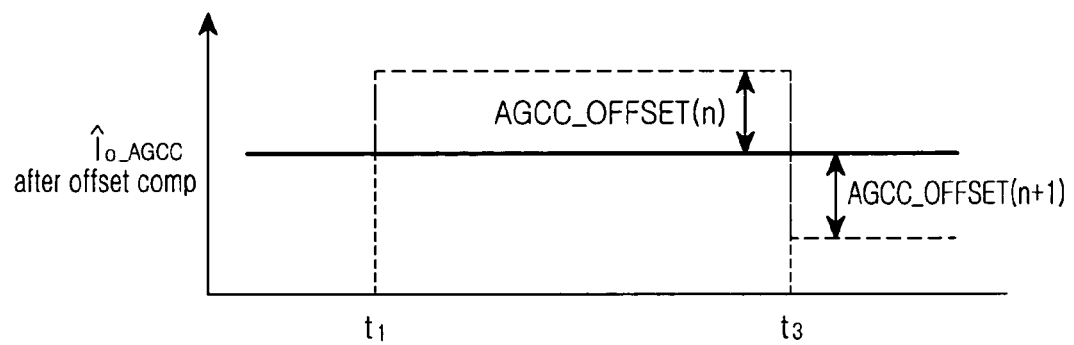

FIG. 5A illustrates the operation timing of the compensation controller 210 illustrated in FIG. 4, and FIG. 5B illustrates the level change of AGCC_GAIN computed in the compensation controller 210. FIGS. 5C and 5D will be described later in connection with a discussion of FIG. 7.

Since the AGC-controlled power level of a discontinuously received signal is variable, errors are generated in the gain output from the AGC 110 during a stabilization period. That is, the compensation controller 210 receives the gain of the distorted received signal on a symbol basis for one slot. Therefore, correction of the AGC errors is equivalent to compensation of the gain from the AGC 110, that is, AGC_VALUE.

The timing controller 211 outputs GAIN_CLK and REF_GAIN_CLK to the sampler 212 in response to T125. At the same time, the timing controller 211 outputs REF_GAIN_CLK to the storage 215. Referring to FIG. 5A, AGC_VALUE is synchronized to T125 and frequency-divided into a predetermined number of samples according to GAIN_CLK in the sampler 212. The frequency-division numbers of AGC_VALUE are used as symbol indexes and the clock pulses of T125 represent slot indexes.

Figure 2C:
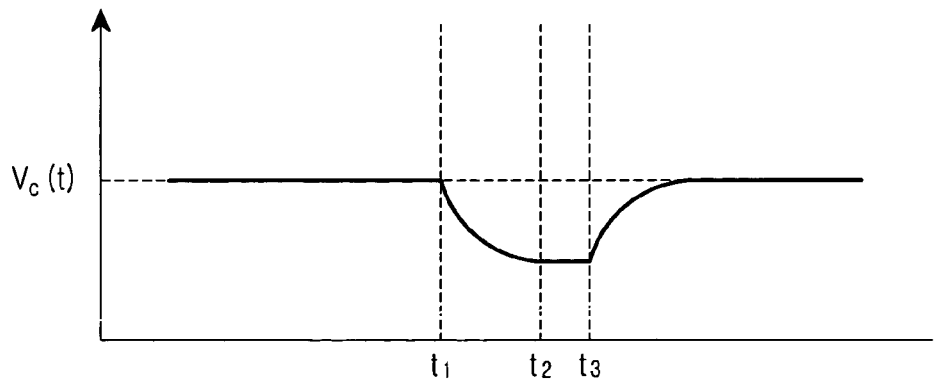

The sampler 212 outputs AGC_VALUE samples by sampling AGC_VALUE according to GAIN_CLK and REF_GAIN_CLK. AGC_VALUE output from the sampler 212 in response to REF_GAIN_CLK is stored as $G_{REF}$ for one slot in the storage 215. The first subtractor 213 subtracts an AGC_VALUE sample generated in response to GAIN_CLK from $G_{REF}$. The first look-up table 214 obtains AGC-C_GAIN by comparing $G_{COMP}$ received from the first subtractor 213 with a stored value. As illustrated in FIG. 5B, since AGCC_GAIN is calculated in correspondence with AGC_VALUE, its level changes in the opposite to the level change illustrated in FIG. 2. The compensator 220 illustrated in FIG. 3 compensates Z(n, m) with AGCC_GAIN.

$$AGCC\_GAIN = (g_{REF}(n)/g(n,m))^2 \quad (2)$$

Meanwhile, the second subtractor 216 calculates the offset gain $G_{OFFSET}$ by subtracting the reference gain value for the present slot from that for the next slot, upon generation of REF_GAIN_CLK. The second look-up table 217 then obtains AGCC_OFFSET for the present slot by comparing $G_{OFFSET}$ with a corresponding table value. AGCC_OFFSET is calculated by Eq. (3). Returning to FIG. 3, AGCC_OFFSET is reflected in $Z'_{AGCC}(n, m)$ to thereby keep constant the power of a packet data signal input to the symbol demodulator 130.

$$AGCC\_OFFSET = (g_{REF}(n+1)/g_{REF}(n))^2 \quad (3)$$

Hereinafter, a description will be made of a method of compensating the AGC error-caused distorted signal, AGC_VALUE using AGCC_GAIN and AGCC_OFFSET.

Figure 6:
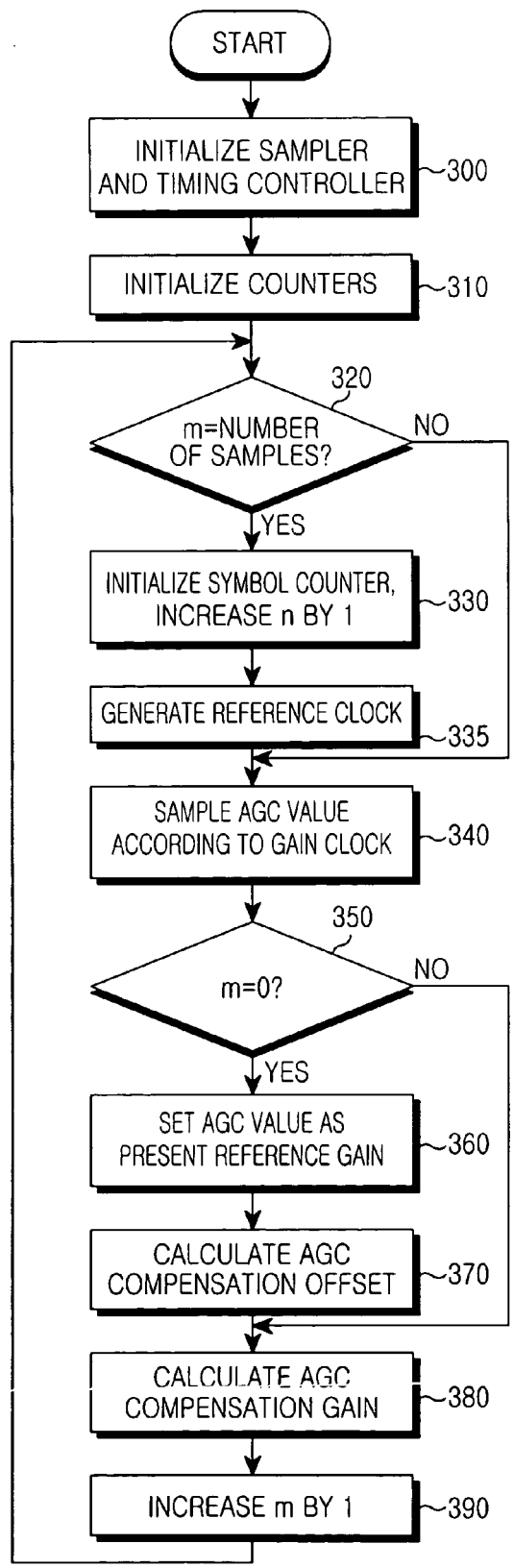
FIG. 6 is a flowchart illustrating a method of compensating the gain of the AGC according to an embodiment of the present invention.

FIG. 6 is a flowchart illustrating a method of correcting AGC errors according to an embodiment of the present invention.

Referring to FIG. 6, the compensation controller 210 sets variables to their initial values in step 300. The variables will be described first.

AGC_VALUE is a control signal for a GCA. A sampling period AGC_SAMP_DUR for AGC_VALUE and the number of samples per slot AGC_SAM_NUM are determined. REF_GAIN_CLK is synchronized to T125, the slot boundary reference signal indicating the start of a slot. GAIN_CLK results from dividing the frequency of REF_GAIN_CLK by AGC_SAM_NUM. GAIN_CLK is used as a sampling clock signal.

The compensation controller 210 initializes counters by setting the symbol index m and the slot index n to 0 s in step 310 and compares m with AGC_SAM_NUM in step 320. If m is equal to AGC_SAM_NUM, the compensation controller 210 sets m to the initial value, 0 and increases n by 1 (n=n+1) in step 330. The compensation controller 210 generates REF_GAIN_CLK in step 335 and proceeds to step 340. If m is not equal to AGC_SAM_NUM in step 320, the compensation controller 210 performs step 340.

After the compensation controller 210 samples AGC_VALUE according to GAIN_CLK in step 340, it determines whether m is the initial value, 0 in step 350.

If m is 0, the compensation controller 210 sets AGC_VALUE for the present symbol as a reference gain for an nth slot, $G_{REF}(n)$ ($G_{REF}(n)$=AGC_VALUE) in step 360. AGC_VALUE being $G_{REF}(n)$ is extracted at each slot start point and stored as $G_{REF}(n)$ for the slot in the storage 215. Using $G_{REF}(n)$, AGCC_GAIN is extracted in relation to the AGC error of each symbol. Since the control signal for the GCA and the gain of the GCA in the AGC loop is in the relationship of an exponential function, the relationship between AGC_VALUE and the gain of the GCA is expressed as Eq. (4). For reference, upon input of T125 at each slot start point (m=0), the timing controller 211 generates REF_GAIN_CLK and thus the storage 215 extracts $G_{REF}$ each time it receives REF_GAIN_CLK, in steps 330 and 335.

$$20 \cdot \log_{10}(g(m)) = AGC\_VALUE(m) \times AGC\_GAIN\_STEP$$

$$20 \cdot \log_{10}(g_{REF}) = G_{REF}(n) \times AGC\_GAIN\_STEP = AGC\_GAIN(0) \times AGC\_GIN\_STEP \quad (4)$$

In step 370, AGCC_OFFSET is calculated using $G_{REF}(n)$ by $$G_{OFFSET}(n-1) = G_{REF}(n) - G_{REF}(n-1) \quad (5)$$

$$AGCC\_OFFSET(n-1) = AGCC\_LUT(G_{OFFSET}(n-1)) \quad (6)$$

and then step 380 is performed. On the other hand, if m is not 0 in step 350, the procedure proceeds to step 380.

The compensation controller 210 obtains an offset gain $G_{OFFSET}(n-1)$ for the previous slot by calculating the difference between the reference gain $G_{REF}(n)$ for the present AGC_VALUE and the reference gain $G_{REF}(n-1)$ for the previous slot by Eq. (5). By Eq. (6), the compensation controller 210 sets the AGC compensation offset of the previous AGC compensation offset gain $G_{OFFSET}(n-1)$ as the previous AGC compensation offset AGCC_OFFSET(n-1) using the second look-up table 217. The compensator 220 reflects AGCC_OFFSET(n-1) in the distorted signal.

In step 380, the compensation controller 210 calculates AGCC_GAIN by $$G_{COMP}(m) = G_{REF}(n) - AGC\_VALUE(m) \quad (7)$$

$$AGCC\_GAIN = \left(\frac{g_{REF}(n)}{g(m)}\right)^2 = 10^{[G_{COMP}(m) \times AGG\_GAIN\_STEP/10]}$$

The compensation controller 210 obtains the compensation gain $G_{COMP}(m)$ for the present symbol by calculating the difference between the reference gain $G_{REF}(n)$ for the present slot and the AGC value AGC_VALUE(m) for the present symbol by Eq. (7). It then obtains a value expressed as an exponential function in the first look-up table 214 in Eq. (8), corresponding to $G_{COMP}(m)$, as AGCC GAIN.

$$AGCC\_LUT(x) = 10^{5x \cdot AGC\_GAIN\_STEP/10} \quad (8)$$

By applying Eq. (7) to Eq. (8), the AGC compensation gain for the present symbol in the present slot, AGCC_GAIN(n, m) is expressed as $$AGCC\_GAIN(n, m) = AGCC\_LUT(G_{COMP}(m)) \quad (9)$$

After calculating AGCC_GAIN, the compensation controller 210 increases m by 1 in step 390 and returns to step 320.

It should be noted that step 370 for calculating AGCC_OFFSET and offset compensation with AGCC_OFFSET is optional.

The offset compensator 250 obtains a compensation offset $G_{OFFSET}$ by multiplying AGCC_OFFSET by a compensation gain product $Z'_{AGCC}(n-1, m)$ for the previous slot according to Eq. (10). $Z'_{AGCC}(n-1, m)$ is the product of the compensated AGC value and the estimated symbol energy. $Z_{AGCC\_OFFSET}(n-1, m)$ results from compensating $Z'_{AGCC}(n-1, m)$ for its power offset, thereby making the power of $Z'_{AGCC}(n-1, m)$ constant.

$$Z_{AGCC\_OFFSET}(n-1, m) = AGCC\_OFFSET(n-1) \\ *Z'_{AGCC}(n-1, m) \quad (10)$$

The compensator 220 multiplies AGCC_GAIN by the distorted received signal, thereby compensating the signal for AGC errors. The compensated signal $Z_{AGCC}(n, m)$ is expressed as $$Z_{AGCC}(n, m) = \left(\frac{g_{REF}(n)}{g(n, m)}\right)^2 \times Z(n, m) \quad (11)$$

$$= g_{REF}^2 P \times [|h_m|^2 \chi(n, m) + h(n, m)^* n(n, m)]$$

By Eq. (11), $Z_{AGCC}(n, m)$ is calculated by multiplying AGCC_GAIN (=$(g_{REF}(n)/g(n, m))^2$) by Z(n, m) from the first multiplier 123 having a gain from the loop of the AGC 110. Thus, $Z_{AGCC}(n, m)$ renders the variations of the gain of the AGC 110 for one slot fixed to the present reference gain $g_{REF}(n)$. Since $g_{REF}(n)$ is set for each slot, AGC is performed with respect to channel variations on a slot basis. Signal level variations exhibited during this process are shown in FIGS. 5C and 5D.

FIG. 5C illustrates the level of an AGC error-caused distorted signal after reflecting AGCC_GAIN. A dotted line denotes the distorted signal and a solid line denotes the level-controlled signal. The signal distortion is compensated for with AGCC_GAIN and thus the signal power level is kept constant in a corresponding slot. FIG. 5D illustrates the power level of the final received signal after AGCC_OFF- SET compensates the signal for the compensation offsets $G_{OFFSET}$ of its power level involved with the AGC compensation process in each slot. AGCC_OFFSET(n) is calculated at the boundary t3 of the next slot (i.e., (n+1)th slot), at which the next REF_GAIN_CLK is generated, that is, when the next T125 is generated. In the same manner, AGCC_OFFSET(n+1) is calculated when T125 is generated in an (n+2)th slot.

Meanwhile, fading-incurred channel variations are very slow relative to AGC error-caused channel variations. Hence, the slot-based AGC has little influence on the AGC's original function (i.e. keeping constant the power level of a received signal against radio channel changes).

While the first AGC value in a slot is used to calculate AGCC_OFFSET in an embodiment of the present invention, it can be further contemplated as another embodiment of the present invention that the last AGC value in the slot is used as a reference gain value for stabilizing the loop of the AGC 110.

The AGC gain compensation algorithm according to the second embodiment of the present invention is different from that of the first embodiment in that a storage is added to store AGC values because the last AGC value in a slot is used as a reference gain for the slot. Except for the reference gain, offset compensation is performed in the same manner as described above.

While it has been described that offset compensation is performed when the dynamic area of a received signal is to be kept constant, the offset compensation apparatus and operation can be omitted because the offset compensation has little influence on performance.

As described above, the present invention compensates a received signal for signal distortion caused by AGC errors due to discontinuous transmission using an AGC compensation gain and an AFC compensation offset calculated from an AGC gain compensating algorithm. Therefore, the degradation of reception quality of a packet channel due to signal distortion is prevented.

While the invention has been shown and described with reference to certain embodiments thereof, it will be understood by those skilled in the art that various changes in form and details may be made therein without departing from the spirit and scope of the invention as defined by the appended claims.

What is claimed is:

1. An apparatus for compensating the gain of an automatic gain controller (AGC) in a receiver including the AGC for controlling the gain of received packet data in a mobile communication system where packet data is discontinuously transmitted, comprising:
    a compensation controller for receiving an AGC value from the AGC, sampling the AGC value by a predetermined sample number for a predetermined period, and obtaining an AGC compensation gain by calculating the difference between a sampled AGC value with a reference gain for the predetermined period; and
    a compensator for compensating the AGC value with the AGC compensation gain, thereby correcting errors generated in view of the nature of the AGC.

2. The apparatus of claim 1, wherein the reference gain comprises the AGC value extracted at the start of the predetermined period and temporarily stored.

3. The apparatus of claim 2, wherein the compensation controller comprises:
    a timing controller for generating a reference gain clock signal in the predetermined period, and generating a gain clock signal by dividing the frequency of the reference gain clock signal by the predetermined sample number;
    a sampler for sampling the AGC value for the predetermined period in response to the gain clock signal;
    a storage for temporarily storing the AGC value and outputting the AGC value as the reference gain for the predetermined period in response to the reference gain clock signal;
    a first subtractor for subtracting the AGC value sampled in response to the gain clock signal from the reference gain and outputting the difference as a compensation gain; and
    a first look-up table for obtaining the AGC compensation gain by outputting a stored value corresponding to the compensation gain.

4. The apparatus of claim 3, wherein the predetermined period comprises one slot including a transmission unit of packet data.

5. The apparatus of claim 2, further comprising an offset compensator for compensating the power level of the compensated AGC value with an AGC compensation offset calculated in the compensation controller.

6. The apparatus of claim 5, wherein the compensation controller comprises:
    a timing controller for generating a reference gain clock signal in the predetermined period, and generating a gain clock signal by dividing the frequency of the reference gain clock signal by the predetermined sample number;
    a sampler for sampling the AGC value for the predetermined period in response to the gain clock signal;
    a storage for temporarily storing the AGC value and outputting the AGC value as the reference gain for the predetermined period in response to the reference gain clock signal;
    a first subtractor for subtracting the AGC value sampled in response to the gain clock signal from the reference gain and outputting the difference as a compensation gain; and
    a first look-up table for obtaining the AGC compensation gain by outputting a stored value corresponding to the compensation gain.

7. The apparatus of claim 6, wherein the predetermined period comprises one slot including a transmission unit of packet data.

8. The apparatus of claim 7, wherein the compensation controller further comprises:
    a second subtractor for subtracting the reference gain for a present period from a reference gain for a next period extracted in response to a next reference gain clock signal when the predetermined period expires and outputting the difference as a compensation offset; and
    a second look-up table for obtaining the AGC compensation offset by outputting a stored value corresponding to the compensation offset.

9. The apparatus of claim 1, further comprising a symbol energy estimator for estimating the energy of the compensated AGC value received from the compensator and normalizing the estimated energy.

10. A method of compensating the gain of an automatic gain controller (AGC) in a receiver including the AGC for controlling the gain of received packet data in a mobile communication system where packet data is discontinuously transmitted, comprising the steps of:

(1) receiving an AGC value from the AGC, sampling the AGC value by a predetermined sample number for a predetermined period, and obtaining an AGC compensation gain by calculating the difference between a sampled AGC value with a reference gain for the predetermined period; and (2) compensating the AGC value with the AGC compensation gain, thereby correcting errors generated in view of the nature of the AGC.

11. The method of claim 10, wherein the reference gain comprises the AGC value extracted at the start of the predetermined period and temporarily stored.

12. The method of claim 11, wherein the step of (1) comprises the steps of:

generating a reference gain clock signal in the predetermined period, and generating a gain clock signal by dividing the frequency of the reference gain clock signal by the predetermined sample number;

sampling the AGC value for the predetermined period in response to the gain clock signal;

temporarily storing the AGC value and outputting the AGC value as the reference gain for the predetermined period in response to the reference gain clock signal;

subtracting the AGC value sampled in response to the gain clock signal from the reference gain and outputting the difference as a compensation gain; and obtaining the AGC compensation gain by outputting a stored value corresponding to the compensation gain.

13. The method of claim 12, wherein the predetermined period comprises one slot including a transmission unit of packet data.

14. The method of claim 11, further comprising the steps of:

obtaining an AGC compensation offset using the difference between the reference gain for a present period and a reference gain for a next period extracted in response to a next reference gain clock signal when the predetermined period expires; and compensating the power level of the compensated AGC value with the AGC compensation offset.

15. The method of claim 14, wherein the AGC compensation offset obtaining step comprises the steps of:

generating a reference gain clock signal in the predetermined period, and generating a gain clock signal by dividing the frequency of the reference gain clock signal by the predetermined sample number;

sampling the AGC value for the predetermined period in response to the gain clock signal;

temporarily storing the AGC value and outputting the AGC value as the reference gain for the predetermined period in response to the reference gain clock signal;

subtracting the AGC value sampled in response to the gain clock signal from the reference gain and outputting the difference as a compensation gain; and obtaining the AGC compensation gain by outputting a stored value corresponding to the compensation gain.

16. The method of claim 15, wherein the predetermined period comprises one slot including a transmission unit of packet data.

* * * * *